United States Patent
Van De Ven et al.

(10) Patent No.: US 6,630,399 B2
(45) Date of Patent: Oct. 7, 2003

(54) TITANIUM DISILICIDE RESISTANCE IN PINCHED ACTIVE REGIONS OF SEMICONDUCTOR DEVICES

(75) Inventors: Gerardus Everardus Antonius Maria Van De Ven, Nijmegen (NL); Michael John Ben Bolt, Nijmegen (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/128,637

(22) Filed: Apr. 23, 2002

(65) Prior Publication Data

US 2002/0197861 A1 Dec. 26, 2002

(30) Foreign Application Priority Data

Apr. 26, 2001 (EP) .............................. 01201538

(51) Int. Cl.[7] .............................. H01L 21/44
(52) U.S. Cl. ................ 438/664; 438/303; 438/592; 438/664; 438/709; 438/711
(58) Field of Search ............... 438/706, 709, 438/710–711, 726, 592, 663–664, 655, 651, 649, 301, 303, 305, 682–683; 257/382–384, 388, 412–413, 754–755, 757, 768–770

(56) References Cited

U.S. PATENT DOCUMENTS

| | | | |
|---|---|---|---|
| 5,681,780 A | 10/1997 | Mihara | .............. 438/700 |
| 6,036,816 A | * 3/2000 | Kojima et al. | ......... 156/345.22 |
| 6,376,384 B1 | * 4/2002 | Yen et al. | ................ 438/706 |
| 6,444,404 B1 | * 9/2002 | Chen et al. | ................ 430/314 |

* cited by examiner

Primary Examiner—Carl Whitehead, Jr.
Assistant Examiner—Thanh Nguyen
(74) Attorney, Agent, or Firm—Aaron Waxler

(57) ABSTRACT

A method of manufacturing a semiconductor device (2) on a substrate (1), the semiconductor device including an active area (5, 6, 16) in the substrate (1) demarcated by spacers (10–13,20–23) and arranged so as to contact an interconnect (29) including $TiSi_2$; the method includes:

depositing an oxide layer (26) on the substrate (1);

depositing and patterning a resist layer (27) on the oxide (26);

reactive ion etching of the oxide (26) to demarcate the active area (5, 6, 16), using the patterned resist layer (27);

removing the resist (27) by a dry strip plasma containing at least oxygen;

depositing titanium (28) on the oxide (26) and the active area (5, 6, 16);

forming the interconnect (29) as self-aligned $TiSi_2$ by a first anneal, a selective wet etch, and a second anneal;

the dry strip plasma including, as a second gaseous constituent, at least fluoride.

4 Claims, 3 Drawing Sheets

TITANIUM DISILICIDE RESISTANCE IN PINCHED ACTIVE REGIONS OF SEMICONDUCTOR DEVICES

The present invention relates to a method as defined in the preamble of claim 1.

In sub-micron generations of silicon-based microelectronic devices (integrated circuits, ICs), titanium disilicide ($TiSi_2$) is the material used for the first level metallization and interconnect of gate structures and active areas. Due to its low resistivity of 16 $\mu\Omega$ cm (compared to poly-silicon: ±300 $\mu\Omega$ cm), $TiSi_2$ is used to reduce the sheet resistance of poly-silicon gates and the active areas. Also, $TiSi_2$ reduces the contact resistance on these areas. A lower sheet resistance and a lower contact resistance result in a lower delay time in circuit (RC-delay), as a result of which the performance level of a circuit is enhanced. As known in the art, the application of $TiSi_2$ has a further advantage relating to IC manufacturing. $TiSi_2$ is formed in a self-aligned silicidation process (salicide process): a titanium layer deposited on a patterned $Si/SiO_2$ structure can selectively form $TiSi_2$ on the areas where titanium is in contact with silicon.

Titanium disilicide is known to have two crystalline modifications: the low-resistivity C54 structure and high-resistivity C49 structure. During self-aligned formation of $TiSi_2$ in a first annealing step the $TiSi_2$ C49 structure is formed. The C49 structure, however, is a metastable phase and can be transformed into the desirable stable C54 structure by a second annealing step. As known to persons skilled in the art, the size of the area where titanium and silicon are in contact during the self-aligned process strongly influences the transformation from the C49 to the C54 structure, which is illustrated by the effective transformation temperature for the transition of $TiSi_2$ C49 to $TiSi_2$ C54. For smaller contact areas, a higher annealing temperature is required to transform $TiSi_2$ C49 to $TiSi_2$ C54. Obviously, with the continuing increase of circuit density (and the accompanying size reduction of on-chip components) from one IC generation to the next, the thermal exposure during $TiSi_2$ formation increases accordingly, which may adversely affect the overall quality of an IC.

Particularly, in semiconductor devices containing MOSFET structures having so-called pinched active areas with a feature size of 0.25 $\mu$m or less, proper silicidation of these active areas as well as the gate areas may become troublesome due to limitations in the process window. An overview of the development of advanced Ti silicide processes and their applicability to deep-sub-micron technologies is described by J. A. Kitl and Q. Z. Hong in "Self-aligned Ti and Co silicides for high performance sub-0.18 $\mu$m CMOS technologies", Thin Solid Films, 320 (1998) pp. 110–121.

It is observed that the reactive ion etching process, which is applied to define these active areas in MOSFETs, forms an impurity layer on the etched openings of Si. In this reactive ion etching (RIE) process, which uses a plasma containing $CF_4$, $CHF_3$, and Ar, the etching process stops at the silicon surface but contaminates the etched openings of Si with carbon, fluorine and hydrogen impurities.

From Japanese patent application JP-A-7-142447, it is known that on a $Si/SiO_2$-patterned surface the impurity layer at the surface of the Si openings actually consists of two layers: a contamination Si top layer and a damaged Si layer below that Si top layer. These Si layers are best removed by a two-step dry etching process in a plasma of $CF_4$ and $O_2$. In the first step, the contamination layer is removed, while in the second step the damaged layer is removed by an isotropic etch of 10 nm Si. In this etching process, also the resist layer is removed. In this document, this RIE process based on a plasma of $CF_4$ and $O_2$ is used for a cleaning step after the formation of the oxide spacers.

From U.S. Pat. No. 5,681,780, a resist strip process is known that combines the etching of a resist layer and the etching of a damaged Si layer in the openings, which damage is caused by a preceding RIE process to form contact openings in an oxide layer on a Si substrate. U.S. Pat. No. 5,681,780 describes a method wherein such a resist strip process based on a plasma of $CF_4$ and $O_2$ is used as a single step process.

It is an object of the present invention to provide a method enabling proper silicidation on so-called pinched active areas of semiconductor devices.

The present invention relates to a method of manufacturing a semiconductor device on a substrate, the semiconductor device comprising at least one active area in the silicon substrate demarcated by spacers; the at least one active area further being arranged so as to be a contact area contacting an interconnect region comprising titanium disilicide; the method comprising the steps of:

Depositing an oxide layer on the substrate;

Depositing a resist layer on the oxide layer;

Patterning of the resist layer;

Etching an opening in the oxide layer to demarcate the at least one active area, by means of a reactive ion etching process, using the resist layer patterned in the previous step;

Removing the resist layer in a dry strip process by means of a microwave plasma comprising at least oxygen as a gaseous constituent;

Depositing a metal layer comprising titanium, on top of the oxide layer and on the at least one active area;

Forming the interconnect region comprising titanium disilicide by a self-aligned process comprising a first annealing step, a selective wet etching step, and a second annealing step;

characterized in that the microwave plasma of the dry strip process comprises a second gaseous constituent, comprising at least fluoride, for cleaning and etching the surface of the at least one active area and isotropically etching the spacers.

Thus, in contrast to the resist strip processes in accordance with the prior art, the etching process according to the present invention using the $CF_4/O_2$ plasma of the dry strip process is performed on active areas as a last step before silicidation of these active areas. By applying this etching step as a last step before deposition of Ti (and subsequent silicidation), the sheet resistance of the $TiSi_2$ layer on these active areas is substantially reduced.

Moreover, the present invention relates to a method as described above, characterized in that the second gaseous constituent is carbon-tetra-fluoride $CF_4$.

Furthermore, the present invention relates to a method as described above, characterized in that the width of the at least one active area is 0.35 $\mu$m or less, preferably $\leq 0.25$ $\mu$m.

Also, the present invention relates to a method as described above, characterized in that the spacers comprise silicon nitride side spacers.

Thus, the present invention relates to a method which provides an improved phase transformation from the $TiSi_2$ C49 phase to the $TiSi_2$ C54 phase on small-sized active areas and gate areas without the increase in annealing temperature as observed in the prior art. Thus, the thermal budget during manufacturing an IC (i.e. the exposure to elevated temperatures and the respective exposure time) can be reduced and, as a result, the overall quality of the IC may be less affected.

Below, the invention will be explained with reference to some drawings, which are intended for illustration purposes only and not to limit the scope of protection as defined in the accompanying claims. Especially, where reference is made to p- and n-doped structures, in an alternative embodiment, the opposite doping types may be used.

FIG. 1 schematically shows a cross-sectional view of a semiconductor device during a first step according to the method of the present invention;

FIG. 2 schematically shows a cross-sectional view of a semiconductor device during a second step according to the method of the present invention;

FIG. 3 schematically shows a cross-sectional view of a semiconductor device during a third step according to the method of the present invention;

FIG. 4 schematically shows a cross-sectional view of a semiconductor device during a fourth step according to the method of the present invention;

Figure 1:
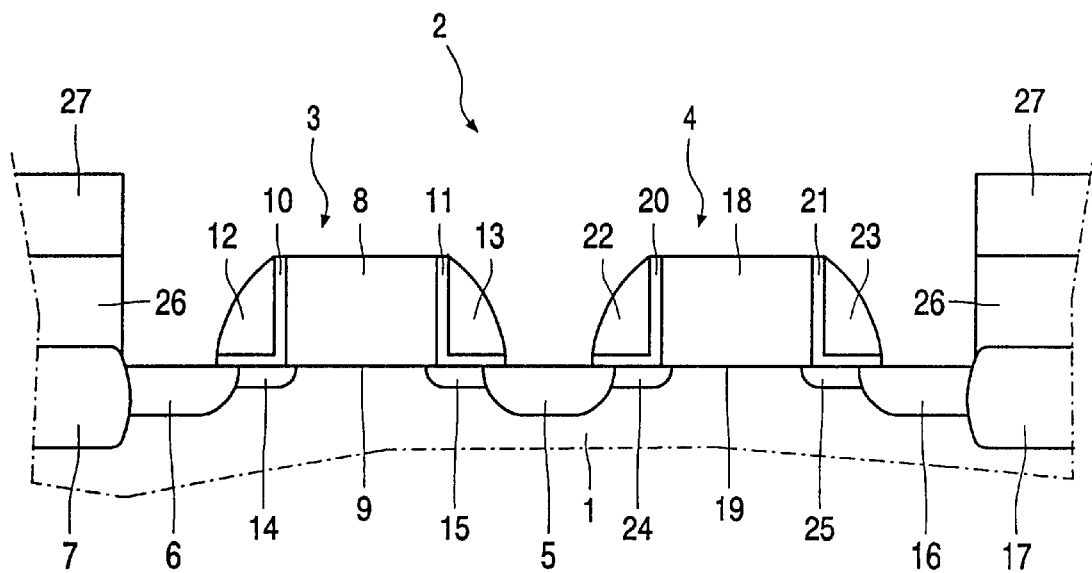

FIG. 1 schematically shows a cross-sectional view of (part of) a semiconductor device during a first step according to the method of the present invention. On a substrate 1 (p-doped), a semiconductor device 2 is arranged comprising two MOSFET transistors 3, 4 with a common $n^+$-doped active area 5, being either a drain or a source. The transistor 3 further comprises an $n^+$-doped active area 6, demarcated by a field oxide 7, an n-doped poly-silicon gate 8, a gate oxide 9, silicon dioxide L-spacers 10, 11, silicon nitride spacers 12, 13, and implanted $n^+$-doped active regions 14, 15. The transistor 4 further comprises an $n^+$-doped active region 16, demarcated by a field oxide 17, an n-doped poly-silicon gate 18, a gate oxide 19, silicon dioxide L-spacers 20, 21, silicon nitride spacers 22, 23, and implanted $n^+$-doped active regions 24, 25. In the device the active areas 5, 6, 16 and the gates 8, 18 have a width of typically 0.25 µm.

It is noted that the semiconductor device 2 is used as an example of devices which comprise "pinched" active areas 5, i.e. active areas with a small surface area. As known in the art, "pinched" active areas may occur in other types of devices as well. Examples of devices that may be produced by the method of the present invention are SRAM devices, ROM devices, and general logic devices, by using design rules for feature sizes smaller than 0.35 µm.

Up to the stage shown in FIG. 1, the semiconductor device was constructed by methods known in the art. Although in FIG. 1 only $n^+$-doped active areas 6, 14, 15, 16, 24, 25 and n-doped poly-silicon gates 8, 18 are shown, it will be appreciated by persons skilled in the art that active areas and poly-silicon gates with opposite conductivities are also feasible.

In the first step, as depicted in FIG. 1, an oxide layer 26, preferably a CVD TEOS film, is deposited in a thickness of approx. 70 nm on the semiconductor device 2. The oxide layer 26 is used as a mask to isolate and protect predetermined areas of silicon (comprising regions on either the substrate or the deposited poly-silicon) from the first metallization level which will be provided by a subsequent silicidation step. On these predetermined areas, for example, unsilicided active regions (on the substrate 1) or unsilicided poly lines (on poly-silicon) can be provided at a later stage.

Subsequently, a photolithographic resist layer 27 is deposited on the oxide layer 26.

In a lithographic step, the resist layer 27 is patterned and the oxide layer 26 is selectively removed by a subsequent dry etching process (reactive ion etching) using the patterned resist layer 27 as a mask. In the oxide layer 26, openings to the substrate 1 and poly-silicon are created. The reactive ion etching (RIE) process is carried out using a plasma containing $CF_4$, $CHF_3$, and Ar, which is well known to persons skilled in the art. As known from the prior art, in the RIE process the etched openings are contaminated with carbon, fluorine and hydrogen impurities.

Figure 2:
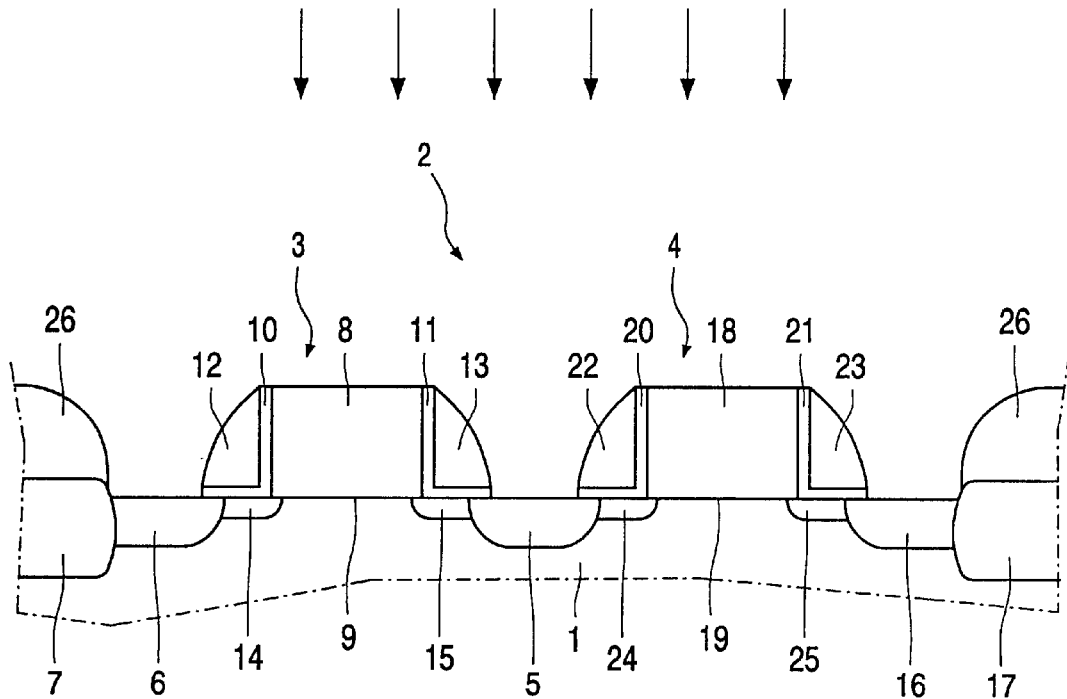

FIG. 2 schematically shows a cross-sectional view of a semiconductor device during a second step according to the method of the present invention. In the second step, a dry strip process is used to remove the resist from the oxide layer 26. As known to persons skilled in the art, in the prior art, at this stage of the process the resist layer is removed by a dry strip process using a microwave plasma containing 100% $O_2$. In the method of the present invention, a dry strip process is applied using a microwave plasma containing $CF_4$ and $O_2$ to remove the remaining resist layer 27 and to clean the active areas 5, 6, 16 and the gates 8, 18, which were exposed to contamination in the preceding RIE process. The $CF_4+O_2$ dry strip process is depicted by the arrows in FIG. 2.

In table 1 a recipe of an exemplary prior art dry strip process is shown.

TABLE 1 dry strip recipe from the prior art.

| Step | Time [s] | Pressure [Torr] | Temp. [° C.] | Power [W] | $O_2$ [sccm] | $N_2/H_2$ [sccm] | $N_2$ [sccm] | $N_2/H_2$ [sccm] |
|---|---|---|---|---|---|---|---|---|
| 1 | Min | 1.5 | 250 | 2000 | 2000 | 314 | 0 | 0 |
| 2 (End) | 200 | 1.5 | 250 | 2000 | 2000 | 314 | 0 | 0 |
| 3 (Over) | 30% | 1.5 | 250 | 2000 | 1900 | 314 | 0 | 1500 |
| 4 | 10 | 1.5 | 250 | 2000 | 1900 | 314 | 0 | 1500 |

Step 1 in table 1 requires a minimal time to stabilize the process conditions. Step 2 uses an endpoint detection relating to the level of $CO_2$ released by the process. The time of step 2 represents an exemplary upper limit value for this step. Step 3 is used as an overetching step, using a process time of 30% of the actual time used in step 2.

In table 2 a recipe of an exemplary dry strip process as used in the present invention is shown.

TABLE 2 exemplary dry strip process recipe of the present invention.

| Step | Time [s] | Pressure [Torr] | Temp. [° C.] | Power [W] | $O_2$ [sccm] | $CF_4$ [sccm] |
|---|---|---|---|---|---|---|
| 1 | Min | 1.5 | 120 | Off | 2300 | 450 |
| 2 | 12 | 1.5 | 120 | Off | 2300 | 450 |
| 3 | 45–60 | 1.5 | 120 | 1500 | 2300 | 450 |

Step 1 in table 2 is a process step to stabilize the process conditions (flows and temperature). The time of step 3 in table 2 is typically in the given range.

It will be appreciated that in the prior art the processes as disclosed in JP-A-7-142447 and U.S. Pat. No. 5,681,780 (as mentioned hereinabove) are used as resist strip and cleaning processes directly after the formation of the oxide spacers and after the formation of contact openings in the oxide layer, respectively. In the present invention the spacer formation is carried out even before the step shown in FIG. 1. The dry strip process is carried out immediately before the deposition of Ti and the subsequent silicidation step. Also it is noted that in the present invention the spacers consist of another material, viz. silicon nitride ($Si_3N_4$).

Figure 3:
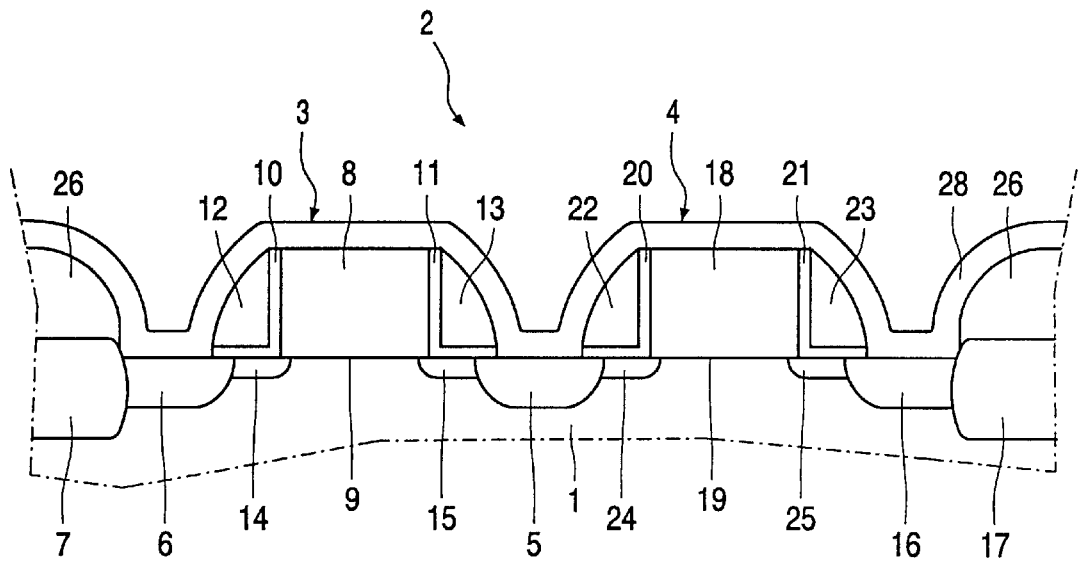

FIG. 3 schematically shows a cross-sectional view of a semiconductor device during a third step according to the method of the present invention. In the third step, a titanium (Ti) layer 28 is deposited on the semiconductor device. The Ti layer typically has a thickness of 33 nm. On the active areas 5, 6, 16 and the gates 8, 18, the Ti layer is in contact with monocrystalline silicon and poly-silicon, respectively.

Figure 4:
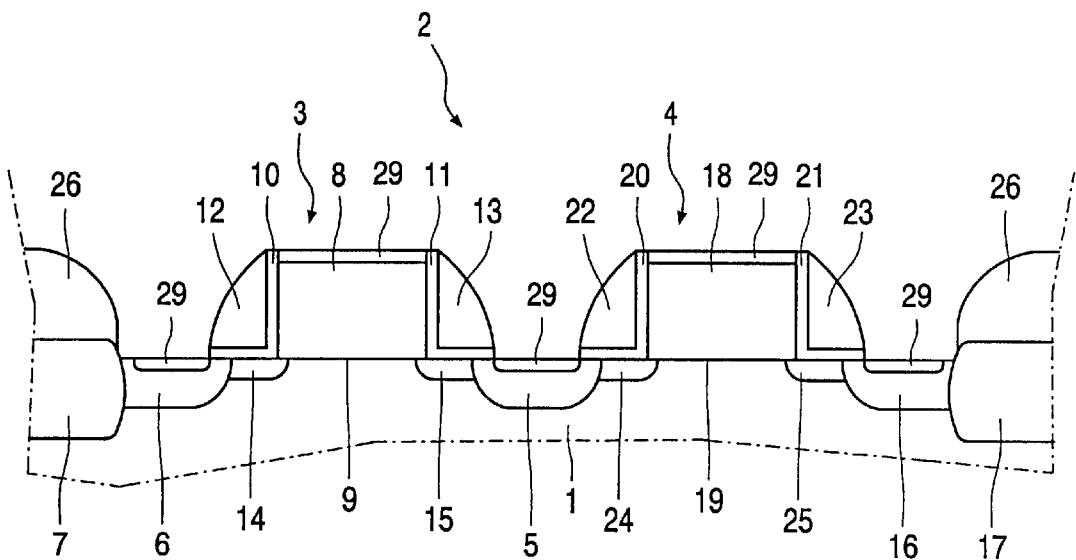

FIG. 4 schematically shows a cross-sectional view of a semiconductor device during a fourth step according to the method of the present invention. In the fourth step, a silicidation process is carried out. The silicidation process comprises the following steps: a first rapid thermal processing (RTP) step, a selective wet etch, and finally, a second RTP step. Typically, in the first RTP step an annealing temperature of 760° C. during 20 s is used. In this step, at active areas 5, 6, 16 and the gates 8, 18, the Ti layer reacts with silicon to form $TiSi_2$ C49. Subsequently, the selective wet etch removes the unreacted part of the Ti layer, while the $TiSi_2$ C49 remains. In the second RTP step at 900° C. during 20 s, the $TiSi_2$ C49 is transformed to $TiSi_2$ C54, which compound is indicated in FIG. 4 by the arrows 29.

Figure 5:
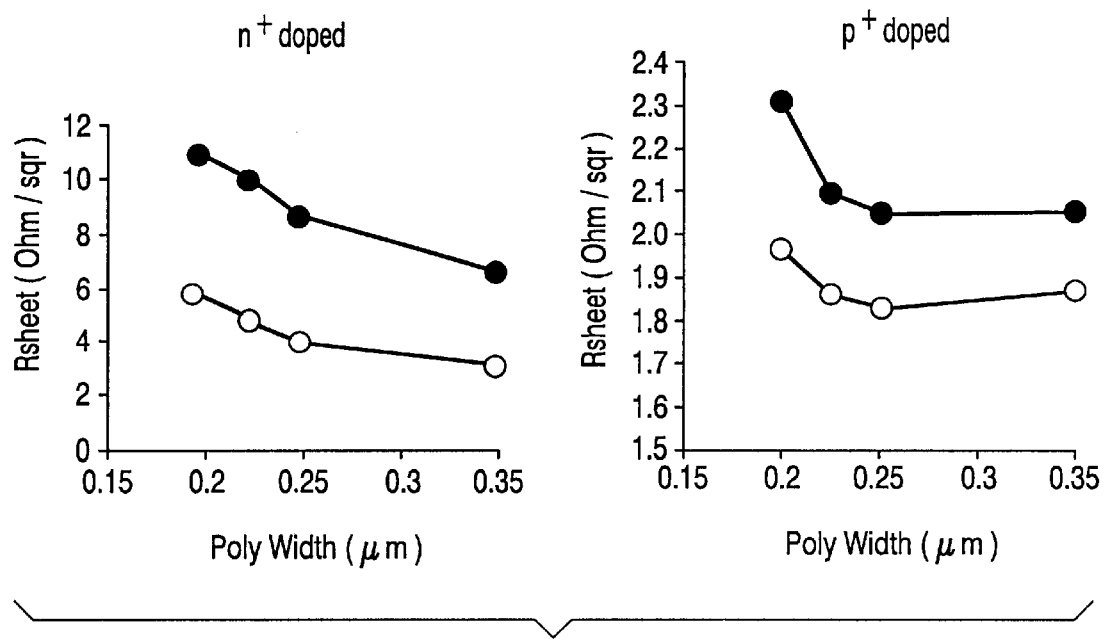
FIG. 5 shows experimental data on the sheet resistance of titanium disilicide on the gate areas for a semiconductor device manufactured according to the method of the present invention.

FIGS. 5a, 5b show experimental data on the sheet resistance of titanium disilicide on the gate areas 8, 18 for a semiconductor device manufactured according to the method of the present invention. The sheet resistance data are plotted as a function of the actual width of the gate area.

The results of the $TiSi_2$ sheet resistance obtained using the dry strip process of the present invention in a first split lot are compared with the results of the $TiSi_2$ sheet resistance obtained in a second split lot in which the dry strip process of the prior art is used. All further processing steps were identical for both split lots. In FIGS. 5a, 5b, open circles denote the results of the $TiSi_2$ sheet resistance obtained using the dry strip process of the present invention. The results of the $TiSi_2$ sheet resistance obtained with the dry strip process of the prior art are denoted by solid circles. In FIGS. 5a, 5b the sheet resistance of titanium disilicide, which was formed on the poly-silicon gate areas 8, 18, is plotted as a function of the actual width of the gate area. FIG. 5a shows results for the sheet resistance of titanium disilicide on n-doped poly-silicon gates 8, 18. FIG. 5b shows results for the sheet resistance of titanium disilicide on p-doped poly-silicon gates.

It is found that for the n-doped poly-silicon gate areas, independent of the gate width, the $TiSi_2$ sheet resistance using the dry strip process of the present invention is about 50% lower than the $TiSi_2$ sheet resistance using the dry strip process of the prior art. For the p-doped poly-silicon gate areas, the $TiSi_2$ sheet resistance using the dry strip process of the present invention is about 10–15% smaller than the $TiSi_2$ sheet resistance using the dry strip process of the prior art. Again, the reduction in $TiSi_2$ sheet resistance is independent of the gate width.

Figure 6:
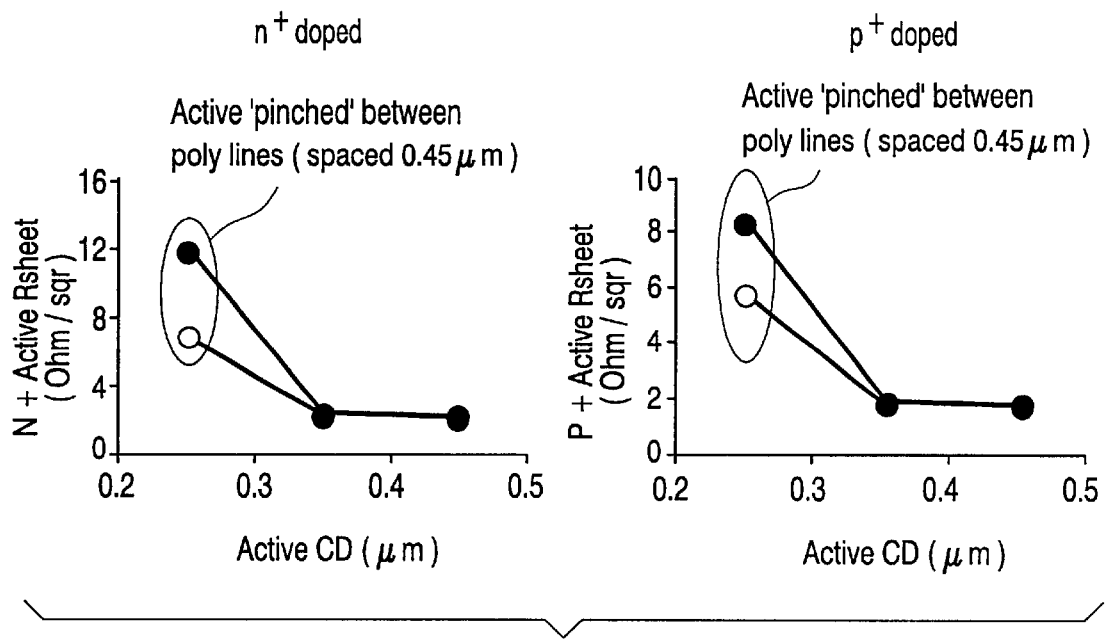
FIG. 6 shows experimental data on the sheet resistance of titanium disilicide on the active areas for a semiconductor device manufactured according to the method of the present invention.

FIGS. 6a, 6b show experimental data on the sheet resistance of titanium disilicide on the active areas for a semiconductor device manufactured according to the method of the present invention. The sheet resistance data are plotted as a function of the actual width of the active area.

The results of the $TiSi_2$ sheet resistance obtained in the first split lot using the dry strip process of the present invention are compared with results of the $TiSi_2$ sheet resistance obtained in the second split lot in which the dry strip process of the prior art is used. All further processing steps were identical for both split lots. In FIGS. 6a, 6b, open circles denote the results of the $TiSi_2$ sheet resistance obtained using the dry strip process of the present invention. The results of the $TiSi_2$ sheet resistance obtained with the dry strip process of the prior art are denoted by solid circles. In FIGS. 6a, 6b, the sheet resistance of titanium disilicide formed on the active areas 5, 6, 16 is plotted as function of the actual width of the active area. FIG. 6a shows results for the sheet resistance of titanium disilicide on $n^+$-doped active areas. FIG. 6b shows results for the sheet resistance of titanium disilicide on $p^+$-doped active areas.

It is found that for the $n^+$-doped active areas, for the smallest active area width of 0.25 $\mu$m, the $TiSi_2$ sheet resistance using the dry strip process of the present invention is about 50% smaller than the $TiSi_2$ sheet resistance using the dry strip process of the prior art. For the active areas, wider than 0.35 $\mu$m, no effect of the dry strip process of the present invention is observed. For the $p^+$-doped active areas, the $TiSi_2$ sheet resistance using the dry strip process of the present invention is about 25% smaller than the $TiSi_2$ sheet resistance using the dry strip process of the prior art. Again, the reduction in $TiSi_2$ sheet resistance is observed only for the smallest active area width of 0.25 $\mu$m. For the active areas, wider than 0.35 $\mu$m, no effect of the dry strip process of the present invention is observed.

Clearly, the reduction of the $TiSi_2$ resistance for the smallest active area can not be attributed only to an improved cleaning of the active area surface by the dry strip process of the present invention. Otherwise, the reduction in $TiSi_2$ sheet resistance should also be observable for larger active area widths. Scanning electron microscopy (SEM) analysis of cross-sections of semiconductor test device samples was carried out as a more detailed investigation. With SEM analysis, the size of structural features in semiconductor test device samples has been determined. In table 3, tentative results regarding the $TiSi_2$ sheet resistance, the size of the width of nitride spacers, the $TiSi_2$ thickness on the active areas, and the thickness of the poly-silicon in the gate area are listed, using the dry strip process of the present invention and a dry strip process of the prior art, respectively, for n-doped as well as for p-doped active areas and gate areas.

TABLE 3

SEM analysis results.

| Parameter | n-doped Prior art | Present invention | p-doped Prior art | Present invention |
|---|---|---|---|---|
| Sheet resistance (Ω/sqr) | 24 | 12 | 17 | 9.7 |
| Spacer width (nm) | 95 | 80 | 90 | 85 |
| TiSi$_2$ thickness on active (nm) | 65 | 75 | 65 | 70 |
| Poly-Si thickness (nm) | 135 | 115 | 145 | 115 |

To summarize the data of table 3, the SEM analysis indicates that by using the present process, the width of the nitride spacers 12, 13, 22, 23 is reduced by approximately 5–10 nm. The thickness of the poly-silicon is reduced by approximately 20 nm, and approximately 10 nm of silicon in the active areas is removed.

Clearly, the dry strip process of the present invention has two distinct effects. The dry strip process cleans the areas 5, 6, 16, 8, 18 by removing contamination left by the RIE process that defined these areas as areas to be silicided. The silicide grown after the dry strip process of the present invention is thicker than after the dry strip process known from the prior art. Additionally, in small active areas 5, 6, 16 (having a width of 0.25 μm or possibly less), the process provides a relatively large sidewall etch, thereby enlarging the area available for silicidation. Thus, the size effect for the transformation of TiSi$_2$ C49 to TiSi$_2$ C54 is reduced, which allows a more complete formation of TiSi$_2$ C54 in these small active areas. Therefore, since the C54 phase has a lower specific resistivity, the sheet resistance decreases as well.

It should be noted that the sidewall etch also takes place on wider active areas, but in that case the relative effect is rather small compared to the effect in the smaller active areas.

What is claimed is:

1. Method of manufacturing a semiconductor device (2) on a substrate (1), the semiconductor device (2) comprising at least one active area (5, 6, 16) in the substrate (1) demarcated by spacers (10–13, 20–23); the at least one active area (5, 6, 16) further being arranged so as to be a contact area contacting an interconnect region (29) comprising titanium disilicide; the method comprising the steps of:

Depositing an oxide layer (26) on the substrate (1);

Depositing a resist layer (27) on the oxide layer (26);

Patterning of the resist layer (27);

Etching an opening in the oxide layer (26) to demarcate of the at least one active area (5, 6, 16), by means of a reactive ion etching process, using the resist layer (27) patterned in the previous step;

Removing the resist layer (27) in a dry strip process by means of a microwave plasma comprising at least oxygen as a gaseous constituent;

Depositing a metal layer (28) comprising titanium, on top of the oxide layer (26) and on the at least one active area (5, 6, 16) immediately after the removing the resist layer (27) step;

Forming the interconnect region (29) comprising titanium disilicide by a self-aligned process comprising a first annealing step, a selective wet etching step, and a second annealing step;

characterized in that the microwave plasma of the dry strip process comprises a second gaseous constituent, comprising at least fluoride, for cleaning and etching the surface of the at least one active area (5, 6, 16) and isotropically etching the spacers (10–13, 20–23).

2. Method according to claim 1, characterized in that the second gaseous constituent is carbon-tetra-fluoride CF$_4$.

3. Method according to claim 1 or 2, characterized in that the width of the at least one active area (5, 6, 16) is 0.35 um or less, preferably ≦0.25 μm.

4. Method according to any of the preceding claims, characterized in that the spacers (12, 13, 22, 23) comprise silicon nitride side spacers.

* * * * *